(12) United States Patent
Zamat

(10) Patent No.: US 6,356,744 B1
(45) Date of Patent: Mar. 12, 2002

(54) POWER MEASUREMENT CIRCUIT

(75) Inventor: Hassan Zamat, San Diego, CA (US)

(73) Assignee: Uniden America Corporation, Forth Worth, TX (US)

( * ) Notice: Subject to any disclaimer, the term of this patent is extended or adjusted under 35 U.S.C. 154(b) by 0 days.

(21) Appl. No.: 09/227,277

(22) Filed: Jan. 7, 1999

(51) Int. Cl.[7] .............................. H03F 1/34; G01S 7/36
(52) U.S. Cl. .................... 455/126; 455/115; 455/226.1; 330/127; 324/76.23
(58) Field of Search ................................ 455/126, 127, 455/115, 553, 552, 226.1, 226.2, 226.4; 375/297; 324/76.23, 76.29; 330/127, 290, 291, 75, 85, 129

(56) References Cited

U.S. PATENT DOCUMENTS

| | | | |
|---|---|---|---|
| 3,946,318 A | * 3/1976 | Gruber ........................ 325/411 |
| 5,151,747 A | 9/1992 | Nourrcier | |
| 5,168,215 A | * 12/1992 | Puzzo ........................ 324/78 |
| 5,179,353 A | * 1/1993 | Miyake ..................... 330/127 |
| 5,241,694 A | * 8/1993 | Vais anen et al. .......... 455/126 |
| 5,381,108 A | * 1/1995 | Whitmarsh et al. ......... 455/126 |
| 5,745,006 A | * 4/1998 | Budnik et al. .............. 455/126 |
| 5,819,165 A | * 10/1998 | Hulkko et al. .............. 455/126 |
| 5,854,971 A | * 12/1998 | Nagoya et al. ............. 330/129 |
| 5,898,906 A | * 4/1999 | Williams .................... 455/126 |
| 5,923,712 A | * 7/1999 | Leyendecker et al. ...... 375/297 |

* cited by examiner

Primary Examiner—Lee Nguyen
Assistant Examiner—Simon Nguyen
(74) Attorney, Agent, or Firm—Howrey, Simon, Arnold & White, LLP

(57) ABSTRACT

A power measurement circuit, suitable for use in communications devices, is provided in which first and second signals derived from the signal of interest are passed through a multiplier, and the output of the multiplier is passed through a filter. In one embodiment, the filter provides a signal substantially representative of or relating to the DC component of the signal output from the multiplier. In another embodiment, the filter provides a signal substantially representative of or relating to the average power of the signal of interest. Advantageously, in one embodiment, the signal output from the filter bears a substantially linear relationship to the average power of the signal of interest over a desired region of operation. In a second embodiment, the signal output from the filter is advantageously substantially frequency invariant over a desired region of operation.

7 Claims, 14 Drawing Sheets

Mini Circuits SCM 2500 Mixer
10 dB Pad On RF Port, IF Port AC Terminated

| dBm Input | mW Input | 824 MHz /907 | 848 MHz /908 | 1850 MHz /909 | 1910 MHz /910 |
|---|---|---|---|---|---|
| 21 | 125.89 | 185 | 178 | -134.5 | -136 |
| 20 | 100.00 | 170 | 165 | -134 | -132 |
| 19 | 79.43 | 156.5 | 153 | -133 | -130.8 |
| 18 | 63.10 | 144.5 | 142.5 | -130 | -129 |
| 17 | 50.12 | 134 | 133.5 | -125.5 | -126 |
| 16 | 39.81 | 125 | 125 | -119.5 | -122 |
| 15 | 31.62 | 116.5 | 117 | -111 | -116 |
| 14 | 25.12 | 109 | 110 | -101 | -107.5 |
| 13 | 19.95 | 101.5 | 102.5 | -88.5 | -97 |
| 12 | 15.85 | 94 | 95.5 | -75 | -86 |
| 11 | 12.59 | 86.5 | 88.5 | -63 | -76 |
| 10 | 10.00 | 79.5 | 82 | -51.5 | -66.5 |
| 9 | 7.94 | 72.5 | 75.5 | -41.5 | -58.5 |
| 8 | 6.31 | 65.5 | 69 | -32.5 | -50.5 |
| 7 | 5.01 | 58 | 61.5 | -24.5 | -43 |
| 6 | 3.98 | 49 | 52.5 | -17.5 | -36 |
| 5 | 3.16 | 39 | 42 | -11.5 | -29.5 |
| 4 | 2.51 | 28 | 31 | -61 | -23.7 |
| 3 | 2.00 | 18 | 20.5 | -1 | -18.2 |
| 2 | 1.58 | 9.2 | 11.3 | 3.7 | -13.1 |
| 1 | 1.26 | 2 | 3.8 | 8.2 | -8.5 |
| 0 | 1.00 | -3.5 | -2.2 | 12.2 | -4.3 |
| -1 | 0.79 | -7.9 | -6.4 | 15.5 | -0.8 |
| -2 | 0.63 | -10.5 | -8.6 | 18 | 2.1 |
| -3 | 0.50 | -11.5 | -9.2 | 19.4 | 4.4 |
| -4 | 0.40 | -11.5 | -8.7 | 19.8 | 5.9 |
| -5 | 0.32 | -10.5 | -7.6 | 19.1 | 6.7 |
| -6 | 0.25 | -9.3 | -6.7 | 17.7 | 6.7 |
| -7 | 0.20 | -8 | -6.1 | 16.2 | 6.1 |

FIG. 9C

POWER MEASUREMENT CIRCUIT

I. BACKGROUND OF THE INVENTION

This invention relates generally to apparatus and methods for measuring power in a circuit, and more particularly, to methods and apparatus for measuring power in a communications system.

A radio frequency (RF) communications system of the cellular type, including a wireless, cordless, or digital PCS communications system, is typically divided into substantially distinct geographical areas or cells, with a base station assigned to each cell, and with the base station configured to handle over a wireless interface communications to and from mobile units which happen to be within the cell. The system typically provides two-way communication between any two mobile units within the system. In addition, the system is typically interfaced to the Public Switched Telephone Network (PSTN), that is, the normal wired telephone network, and allows two-way communication between telephones wired to the PSTN and mobile units within the system.

In such a system, there is a need to regulate the power output of a mobile unit in order to conserve power, and to avoid saturation of the base station. Consider, for example, a cellular system in which two mobile units such as cell phones are within a particular cell, with one of the mobile units situated close to the base station, and the other of the mobile units being situated far from the base station. If the two mobile units transmitted to the base station at the same power, there is a danger that the mobile unit close to the base station would drown out the mobile unit far from the base station, that is, saturate the base station, since the received power from that unit would be large relative to that of the other. Consequently, the base station in such a system typically monitors the signal strength of the mobile units within the cell, and issues commands to these mobile units to adjust their signal strength such that the received signals are at a substantially uniform level. The effect of this is to lower the signal strength of units close to the base station in relation to units far from the base station. In order to ensure that the mobile units are transmitting at the level commanded by the base station, a power measurement circuit is required to measure the power being transmitted by the mobile unit for comparison with the level commanded by the base station.

Another factor is conservation of power at the mobile unit. Typically, such units are powered by power sources such as batteries and the like which have limited lifetimes. If a mobile unit were to transmit at a power level exceeding that required to achieve communication with the base station, the battery life of the mobile unit would be prematurely terminated. In order to conserve battery lifetime, a power measurement circuit is again required to measure the power being transmitted by the mobile unit for comparison with the level needed to communicate with the base station.

Similar needs are present in a satellite communications system, in which a satellite is configured to handle communications to and from a plurality of mobile units over a wireless interface. As in the cellular system, the satellite communications system typically allows two-way communication between any two mobile units within the system. Typically, each satellite in the system communicates to a base station through a wireless interface.

In such a system, if a mobile unit transmitted to a satellite at a power too high in relation to the distance between the mobile unit and the satellite, the satellite might assume that the mobile unit was situated a distance from the satellite greater than the actual distance, and transmit to the mobile unit at too high a level in relation to the actual distance. The capacity of the satellite to handle communications with other base stations might thus be unnecessarily diminished. A power measurement circuit is thus needed to monitor the power of the signal transmitted by the mobile unit to ensure that it is at the appropriate level.

In mobile units such as mobile phones, in which a signal is transmitted to a base station or satellite through a forward or transmit link, a conventional power measurement circuit is based on a Schottky diode which rectifies the transmitted signal. The circuit processes the rectified signal and outputs a voltage related to the power of the signal.

A problem arises because the Schottky diode has undesirable properties, including a power to voltage relationship which is non-linear and also highly frequency dependent. These properties make it difficult to characterize the relationship between power and voltage in the conventional power measurement circuit. Under such conditions, in order to obtain accurate power measurements, it is generally necessary to calibrate each mobile unit over an extensive range of operating variables and also to have that calibration data stored with the mobile unit at all times.

However, because each mobile unit typically exhibits different and unique characteristics, such data must typically be determined for each individual unit, a time-consuming and expensive task. Moreover, the memory required to store such data can be expensive and unduly increase the cost of the mobile unit.

FIG. 1 illustrates a plot of average input power vs. output voltage over various frequencies in an exemplary embodiment of a conventional power measurement circuit. The curve 202 is a plot of power vs. voltage at a frequency $f_1$; the curve 204, a plot of power vs. voltage at a frequency $f_2$; and the curve 205, a plot of power vs. voltage at a frequency $f_3$. As can be seen, for each curve, a non-linear relationship between power and voltage exists. In addition, the output voltage for a given input power is highly dependent on frequency. More specifically, for an input power $P_1$, the output voltage for frequency $f_1$ is $V_1$; that for frequency $f_2$ is $V_2$; and that for frequency $f_3$ is $V_3$.

For a mobile unit exhibiting a relationship between power and voltage as represented by the curves of FIG. 1, it is generally necessary to determine and then store with the mobile unit the data representing each of these curves. This data would then be used to determine the power being transmitted based on the voltage at the output of the power measurement circuit. The cost of performing this calibration procedure, and also the cost of maintaining this data with the mobile unit, can be unduly expensive for a mobile unit, which tends to be a low-cost and high-volume device.

The problem is particularly acute with dual mode phones, that is phones which operate in two distinct frequency bands, such as the 800 MHz cellular band and the 1900 MHz digital PCS band. The typical dual mode phone incorporates two power measuring circuits, one for each frequency band. This is due, in part, to the difficulty of building a single power measuring circuit that will operate in two widely separated frequency bands. The use of two power measuring circuits increases the cost, weight and complexity of the dual mode phone.

Given the current state of the art, there is a need for apparatus and methods for measuring power in which the relationship between average input power and output voltage is a substantial linear relationship over the operating region of interest.

There is also a need for apparatus and methods for measuring power in which the relationship between average input power and output voltage is substantially invariant to frequency over the frequencies or frequency bands of interest.

There is also a need for apparatus and methods for measuring power in which a single power measurement circuit is capable of operating in two or more frequency bands.

There is also a need for apparatus and methods for measuring power that reduce the work and memory required to calibrate the typical communications device.

There is also a need for apparatus and methods for measuring power that overcomes the disadvantages of the prior art.

The objects of the subject invention include fulfillment of any the foregoing needs, singly or in combination. Additional objects and advantages will be set forth in the description which follows, or will be apparent to those of ordinary skill in the art who practice the invention.

II. SUMMARY OF THE INVENTION

To achieve the foregoing objects, and in accordance with the purpose of the invention as broadly described herein, there is provided a power measuring circuit comprising a multiplier coupled to a signal of interest. In one implementation, in which the multiplier is a mixer, the signal is coupled to the RF and local oscillator (LO) inputs of the mixer, and the mixer thus multiplies the signal by itself. A filter is provided for filtering the output of the multiplier. In one implementation, the output of the filter is a signal substantially representative of or relating to the average power of the signal of interest. In another implementation example, the filter is a low-pass filter for low pass filtering the output of the mixer. In a third implementation, the output of the low pass filter is a signal substantially representative of or relating to the DC component of the signal output from the multiplier. Advantageously, the relationship between average input power and output voltage in the circuit is substantially linear over the operating region of interest.

In one implementation in which the multiplier is a mixer, the mixer is operated such that the conversion loss exhibited by the mixer is substantially constant over the operating region of interest relative to a selected one of the LO and RF inputs of the mixer.

In another embodiment, an amplifier is provided to amplify the signal provided to a selected one of the first and second inputs of the multiplier. In one implementation example of this embodiment in which the multiplier is a mixer, the signal provided to the LO input of the mixer is amplified to ensure the mixer is operating in a mode in which the conversion loss exhibited by the mixer is substantially constant with respect to the level of the signal at the LO input of the mixer.

In a further embodiment of the invention, an attenuator is provided to attenuate the signal provided to a selected one of the first and second inputs of the multiplier. In one implementation example of this embodiment in which the multiplier is a mixer, the RF input of the mixer is attenuated to ensure that the mixer is operating in a mode of operation in which the conversion loss exhibited by the mixer is substantially constant with respect to the level of the signal at the RF input of the mixer.

By employing such a circuit in a communications device, the task of calibrating the device is greatly simplified. In a single mode phone, that is, a phone operating at a single frequency or frequency band, only the slope, K, characterizing the relationship between voltage and power at the frequency of operation need be stored with the device. In a dual mode phone, that is, a phone capable of operating at two distinct frequencies, only the slopes, $K_1$ and $K_2$, respectively characterizing the relationship between power and frequency at the two frequencies of interest need be stored with the device.

In yet another embodiment of the invention, the multiplier is such that the relationship between average input power and output voltage is substantially invariant to frequency over the desired region of operation.

By employing a power measurement circuit in accordance with this embodiment in a dual mode phone, the task of calibrating the device is even more simplified. More specifically, in such a device, only a single slope, K, characterizing the relationship between power and voltage over the desired region of operation need be stored with the device because such characterizes the relationship for both frequencies of operation.

There is also provided a related method for measuring the power of a signal of interest comprising the steps of obtaining the signal of interest; multiplying the signal by itself; and deriving from the squared signal a signal representative of the power of the signal of interest.

In a second embodiment of the method, the signal of interest is obtained; first and second signals are derived from the signal of interest; a parameter of a selected one of the first and second signals is adjusted; the adjusted signal and the other of the first and second signals are multiplied by one another to obtain a multiplied signal; and a signal representative of the power of the signal of interest is derived from the multiplied signal. In one implementation, the amplitude of the selected signal is amplified prior to the multiplication step. In another implementation, the amplitude of the selected signal is attenuated prior to the multiplication step. In one implementation example in which the multiplication step is performed by a mixer, the altering step is performed such that the conversion loss of the mixer is substantially constant relative to the amplified or attenuated input over the desired region of operation.

III. BRIEF DESCRIPTION OF THE DRAWINGS

FIG. 1 is a diagram of characteristic voltage vs. power curves exhibited by an exemplary embodiment of a conventional power measurement circuit.

FIGS. 2(a)–2(b) are diagrams of characteristic voltage vs. power curves exhibited by embodiments of the subject invention.

FIG. 3 is an illustration of a first embodiment of the subject invention.

FIGS. 4(a)–4(c) illustrate the principle of operation of an embodiment of the subject invention.

Figure 8:
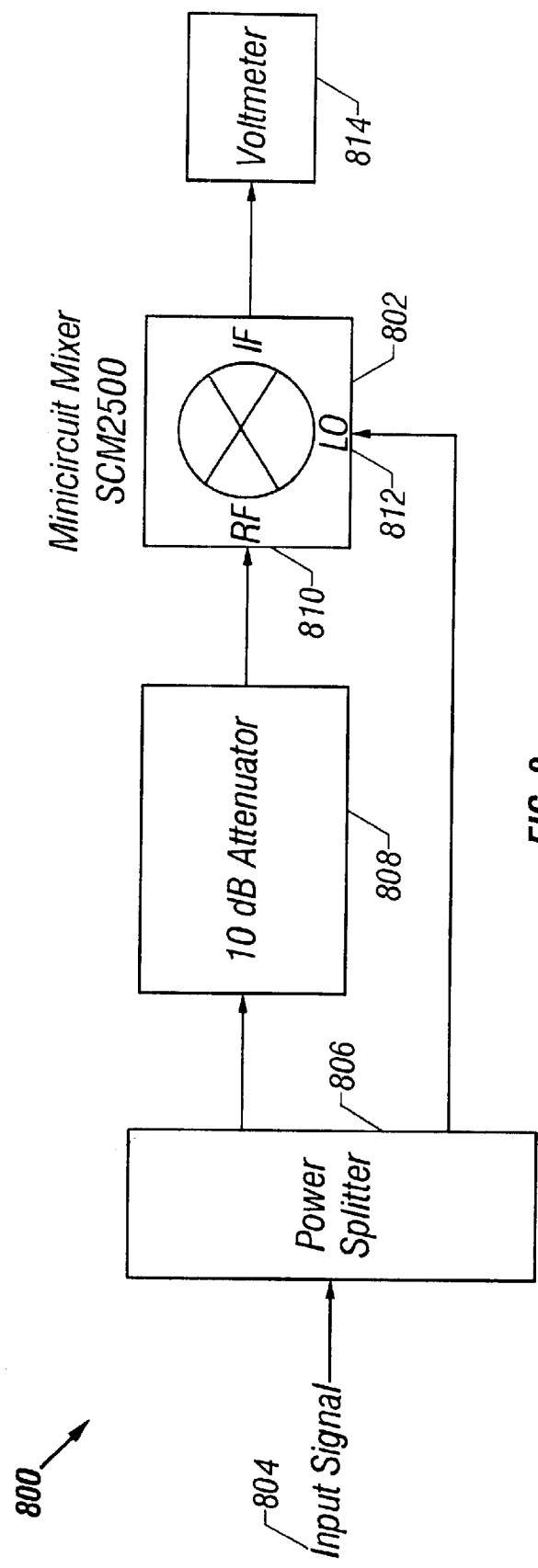
FIG. 8 is a schematic diagram of a prototype of one embodiment of the invention.
Figure 9A:
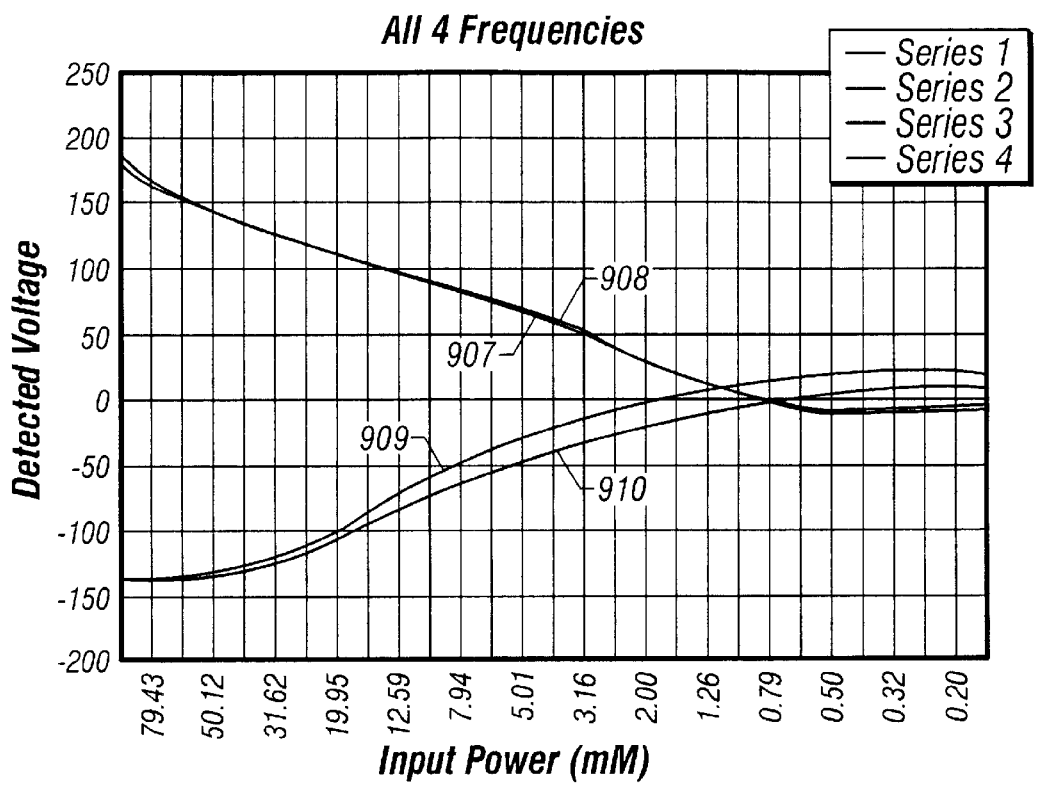
Figure 9B:
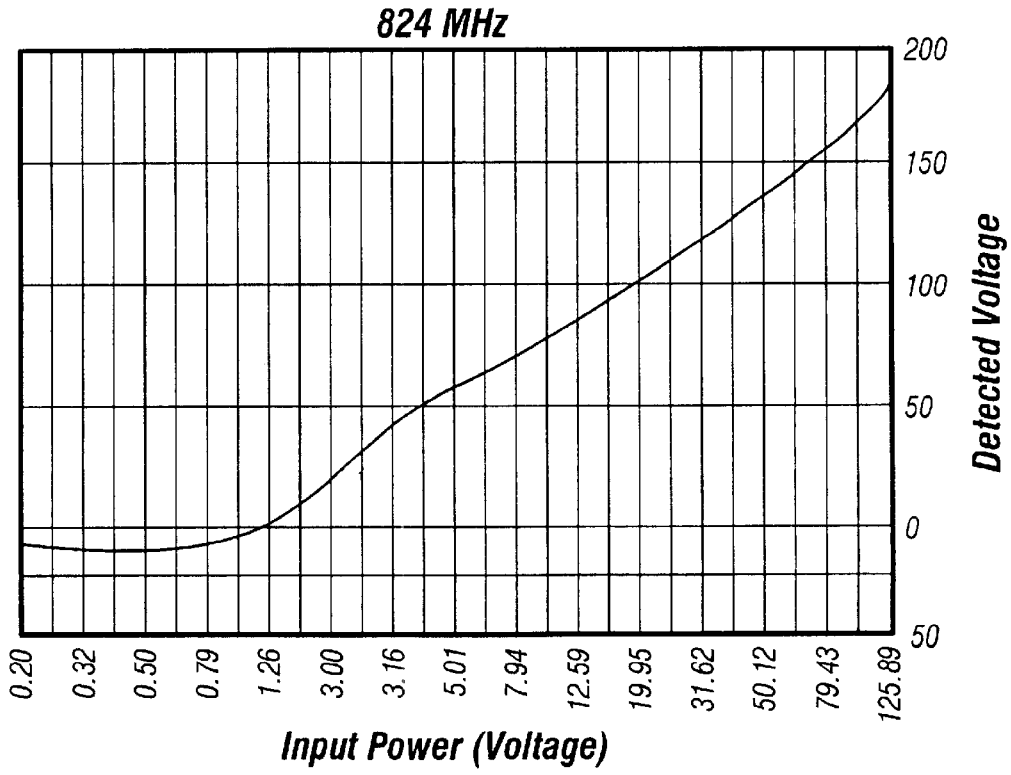

FIGS. 9(a)–9(c) comprises data, in both graphical and tabular form, obtained from the prototype of FIG. 8.

Figure 12:
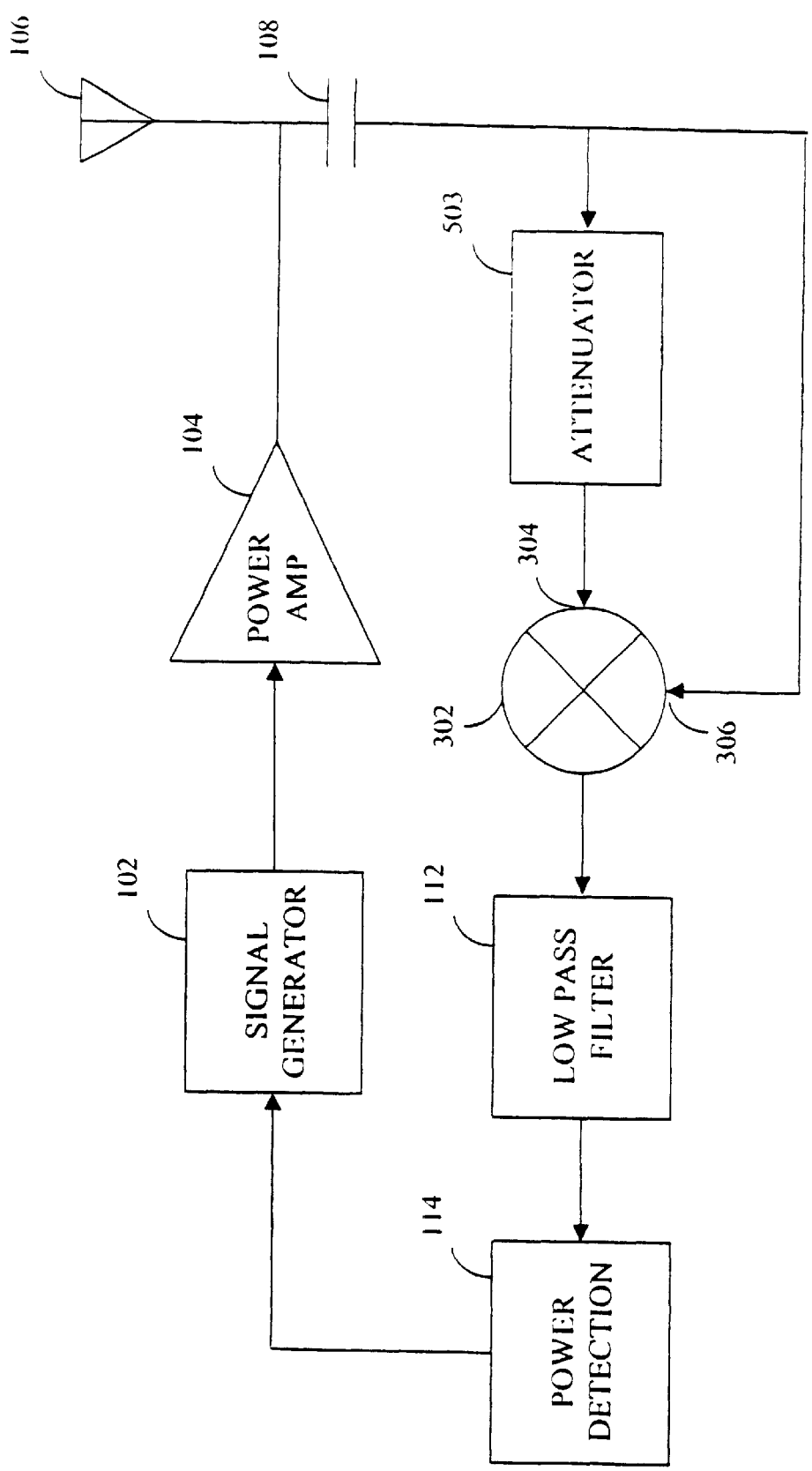

FIG. 12 is an illustration of an implementation of a second embodiment of the subject invention.

Figure 10:
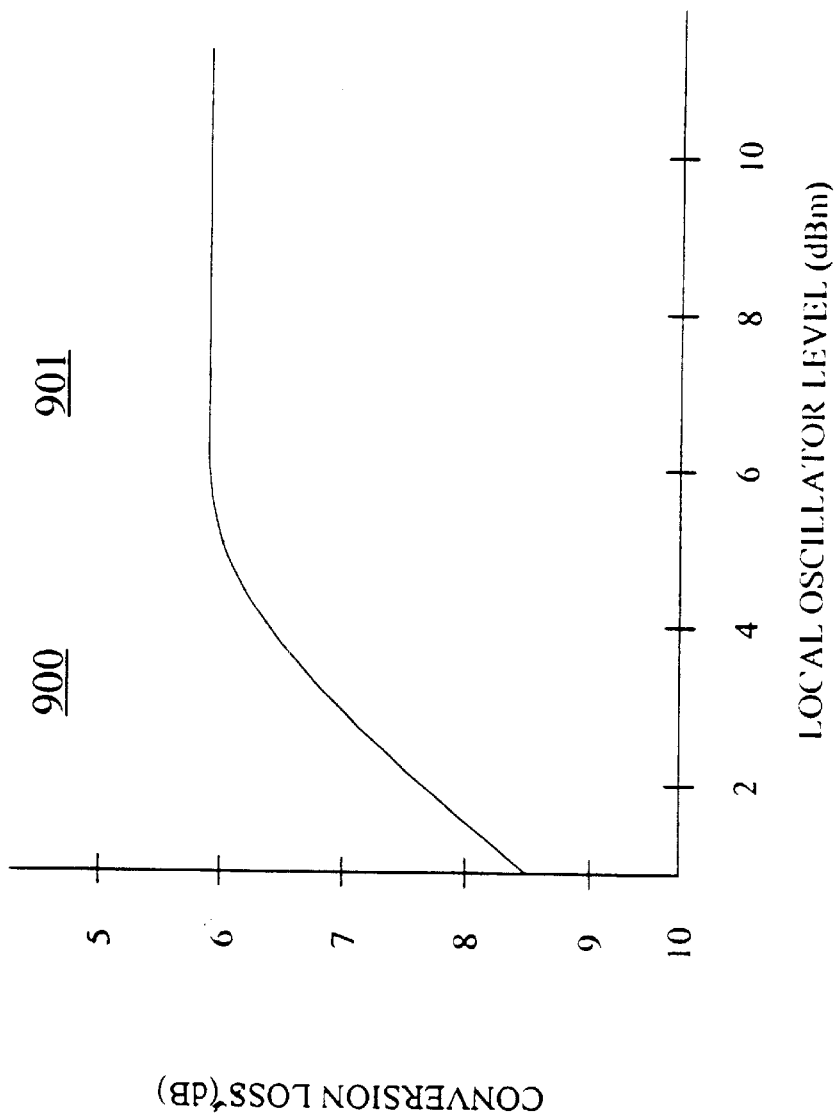
Figure 11:
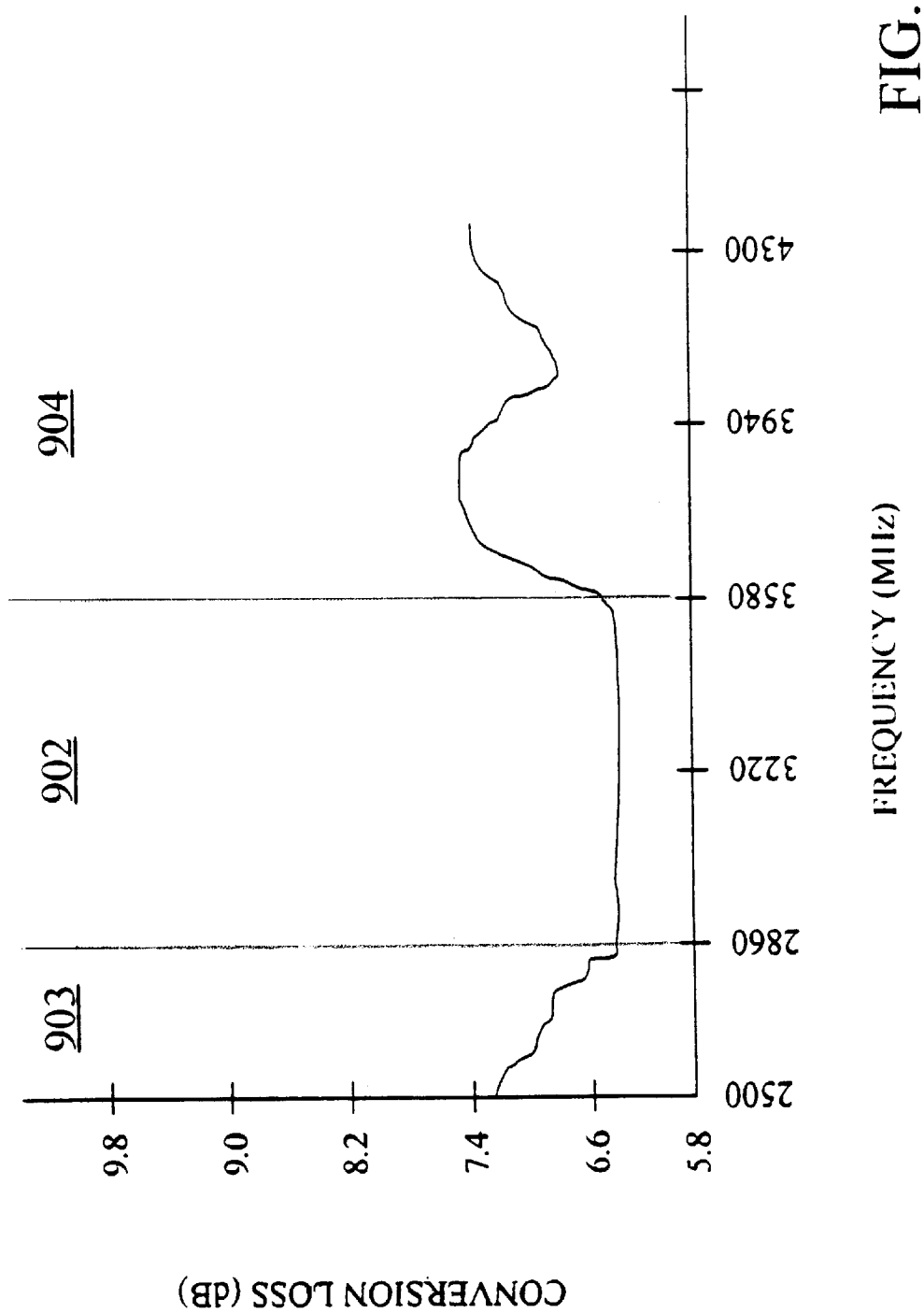
Figure 13:
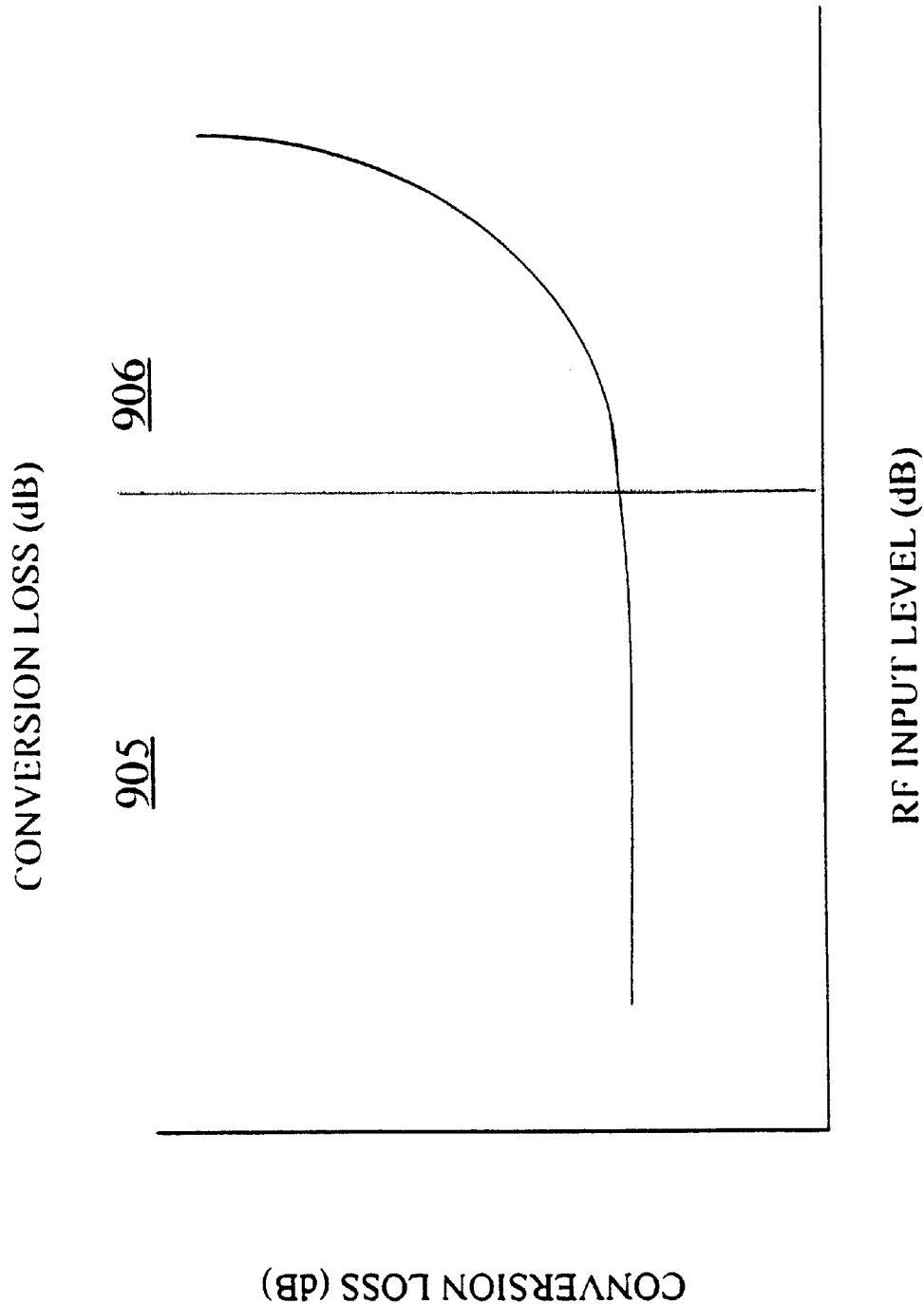

FIGS. 10, 11, and 13 illustrate, in graphical form, the relationship between conversion loss and LO input, RF input, and frequency, respectively, in an exemplary practical embodiment of a mixer.

IV. DESCRIPTION OF THE PREFERRED EMBODIMENTS

Figure 3:
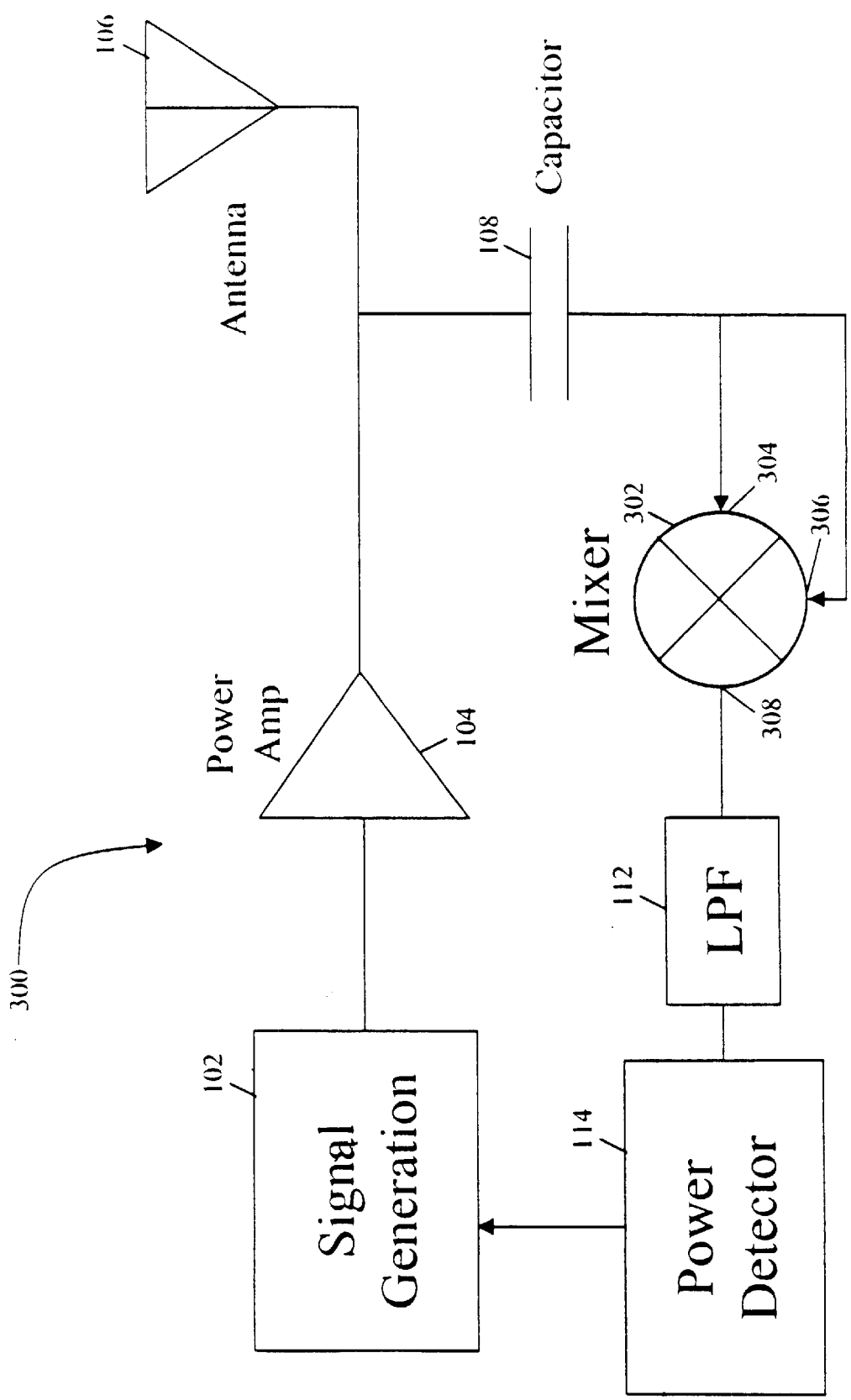

FIG. 3 illustrates the forward link 300 of a mobile unit, such as a cellular, wireless, or digital PCS phone, that is, the link that provides transmission from the mobile to the base station, configured in accordance with the subject invention. This link is illustrated solely to provide an example environment in which the power measurement circuit of the subject invention may be beneficially employed, and should not be construed as limiting.

The signal generation portion 102 of the circuit is shown as a single box to emphasize the components important to power measurement. The power amplifier 104 increases the signal level for broadcast by the antenna 106. The capacitor 108 AC couples the broadcast signal to inputs 304 and 306 of multiplier 302. The output 308 of the multiplier is provided to the low-pass filter 112 which substantially removes the AC components of the signal and outputs a substantially DC voltage which is a function of the power broadcast through the antenna. Power detection and control circuitry 114 receives the output of the low pass filter, and responsive thereto, selectively adjusts the signal generation portion 102 such that the power of the signal broadcast over the antenna 106 is at the appropriate level.

According to a first embodiment of the subject invention, the multiplier 302 is configured to square the signal. Accordingly, the signal is provided to inputs 304 and 306 of the multiplier. In one implementation example, multiplier 302 is a mixer, the input 304 is an RF input to the mixer, the input 306 is the local oscillator (LO) input of the mixer, and the output 308 is the IF output of the mixer. The mixer multiplies the signals at its two inputs, and in doing so, squares the signal and provides the squared signal to the output 308 of the mixer. The output 308 of the mixer is coupled to a low pass filter 112. In one implementation, low-pass filter 112 substantially removes the AC portion of the signal at the output 308, and passes the remaining substantially DC portion of the signal at the output 308 on to the power detection and control 114 portion of the circuit. In this implementation, the output of low-pass filter 112 is thus a signal substantially representative of or relating to the DC component of the output of the mixer. In another implementation, the output of the low-pass filter 112 is a signal substantially representative of or relating to the average power of the signal of interest.

Advantageously, the relationship in this embodiment between the average power of the broadcast signal and the voltage output from the low pass filter 112 is substantially linear over the operating region of interest. In one embodiment, the linear relationship exists between the output voltage and the average power as plotted on a logarithmic scale. In another embodiment, the linear relationship exists between the output voltage and the average power as plotted on a linear scale. In yet another embodiment, the linear relationship exists between the output voltage and the average power, in terms of dB or dBm, as plotted on a linear scale.

It should be appreciated that this linear relationship is an inherent attribute of the first embodiment in which the multiplier functions to square the broadcast signal. As is known, the instantaneous power of the broadcast signal is proportional to the square of that broadcast signal. The DC component of the square of the broadcast signal, provided at the output of the low pass filter 112, will thus be a direct measure of the average value of the power of the broadcast signal. A linear relationship between this DC component and the average power of the broadcast signal is thus an inherent attribute of the foregoing embodiment.

Figure 4A:
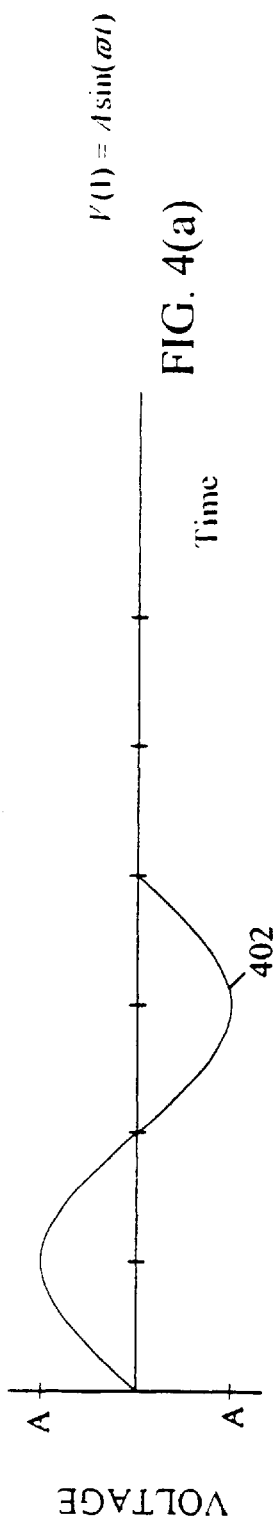
Figure 4B:
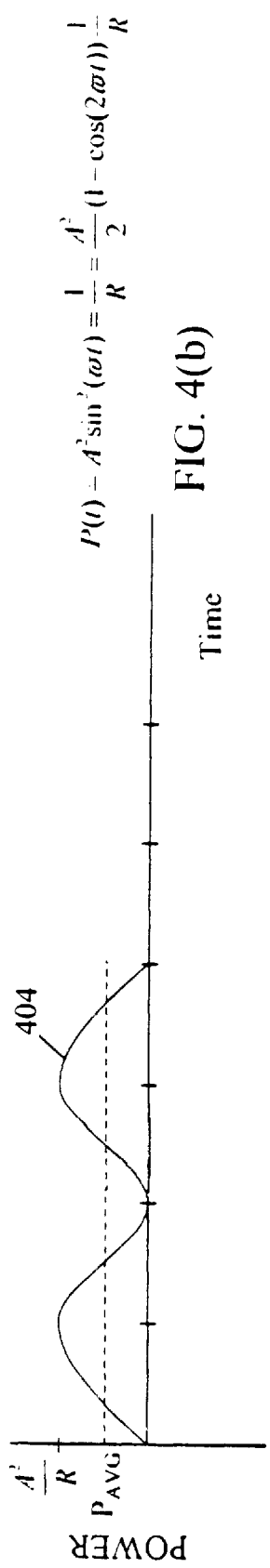
Figure 4C:
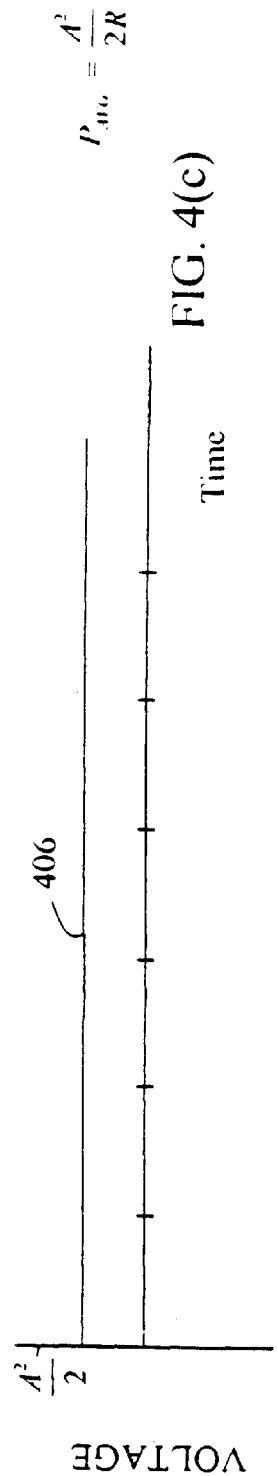

Such can be explained further with reference to FIG. 4. The broadcast signal can be thought of as a complex amalgam of sine and cosine waves. FIG. 4($a$) shows the trace 402 of a single component of the broadcast signal. The particular component illustrated is a single sine wave, $F(t)=A\sin(\omega t)$, where A is the amplitude of the wave, t is the time, $\omega=2\pi f$ is the angular frequency and f is the frequency of the wave. When this single component of the broadcast signal goes through the multiplier 302 in the foregoing embodiment, it will be squared. The resulting squared wave $F^2(t)=A^2\sin^2(\omega t)$ can be separated into DC and AC components as follows: $A^2\sin^2(\omega t)=\frac{1}{2}A^2(1-\cos(2\omega t))$, where $\frac{1}{2}A^2$ is the DC component, and $-\frac{1}{2}\cos(2\omega t)$ is the AC component.

In accordance with the foregoing, the output of the multiplier in this embodiment will be a voltage $V(t)=\frac{1}{2}A^2(1-\cos(2\omega t))$. The output of the multiplier is then input to the low pass filter 112 which ideally will eliminate substantially all AC components and output the remaining substantially DC voltage, $V_{dc}=\frac{1}{2}A^2$ as shown in FIG. 4($c$). This DC voltage is then passed to the power detection and control circuitry 114.

As shown by the trace 404 in FIG. 4($b$), the instantaneous power of the signal output by the multiplier is $P(t)=\frac{1}{2}A^2(1-\cos(2\omega t))(1/R)$, in which R is the resistance at the output of the multiplier. Integrating P(t) over the period T=1/f, and then dividing by T, yields the average power $P_{AVG}$ which, as shown in FIG. 4($b$), is $A^2/2R$. Assuming R is unity, it can be seen that $P_{AVG}$ is equal to the DC voltage output from low pass filter 112.

In the implementation example of this embodiment in which multiplier 302 is a mixer, it should be appreciated that, in practice, the mixer 302 may experience a conversion loss between the signal provided at the RF input of the mixer and the signal provided at the output of the mixer. In one implementation example, the conversion loss is equal to the ratio of the single sideband IF output of the mixer to the RF input level. A graph of the conversion loss typically experienced in one exemplary embodiment of a mixer is illustrated in FIG. 10. Note that, in a region 900, the conversion loss experienced is a function of the magnitude of the signal at the LO input of the mixer, while in a second region 901, the conversion loss experienced is substantially constant with respect to this input.

In order to achieve a substantially linear relationship between the average power of the broadcast signal and the voltage provided at the output of the low pass filter 112 in the embodiment of FIG. 3, the mixer 302 is preferably configured such that it is operating in the region 902 in which the conversion loss is substantially constant.

Figure 1:
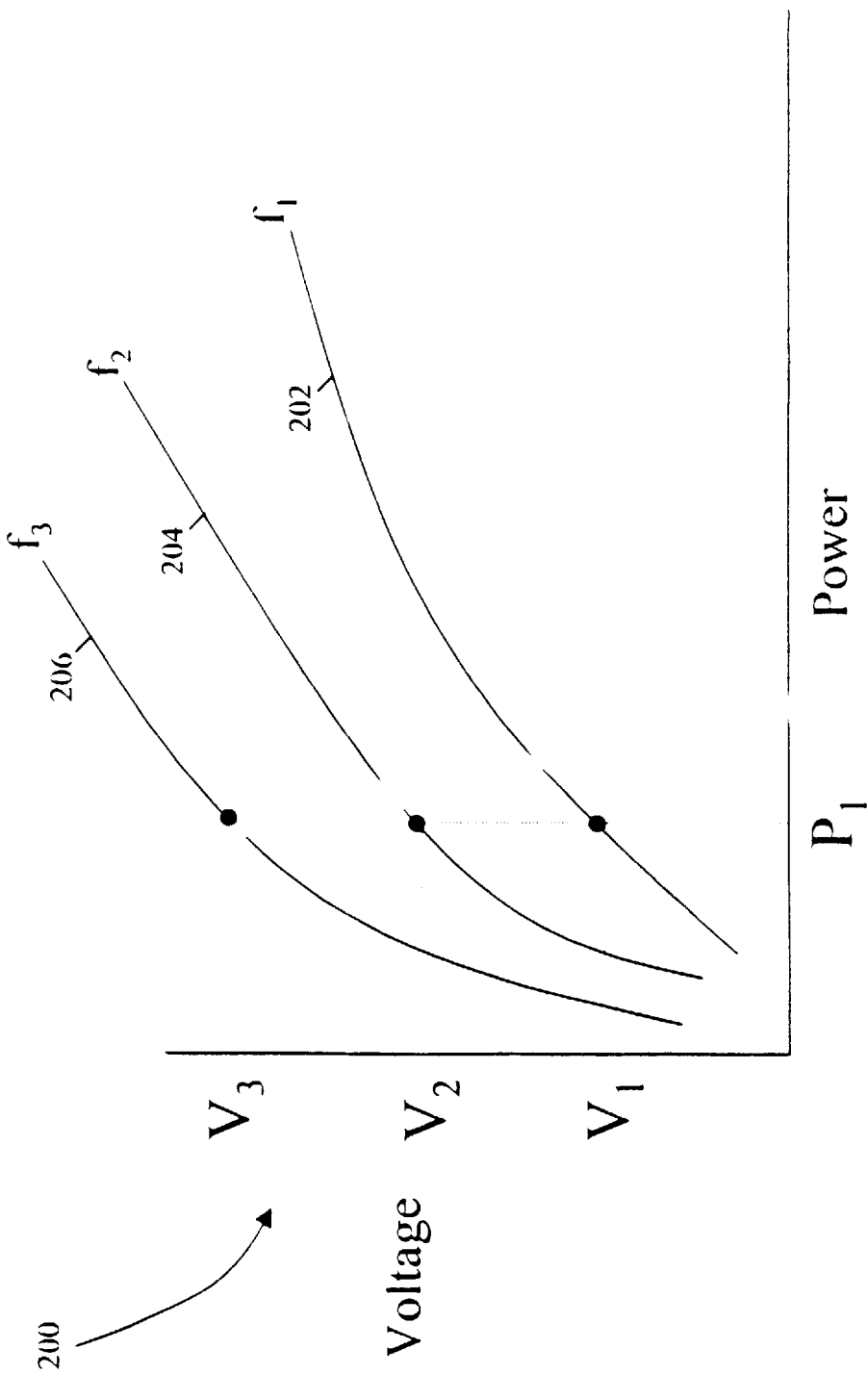
Figure 2B:
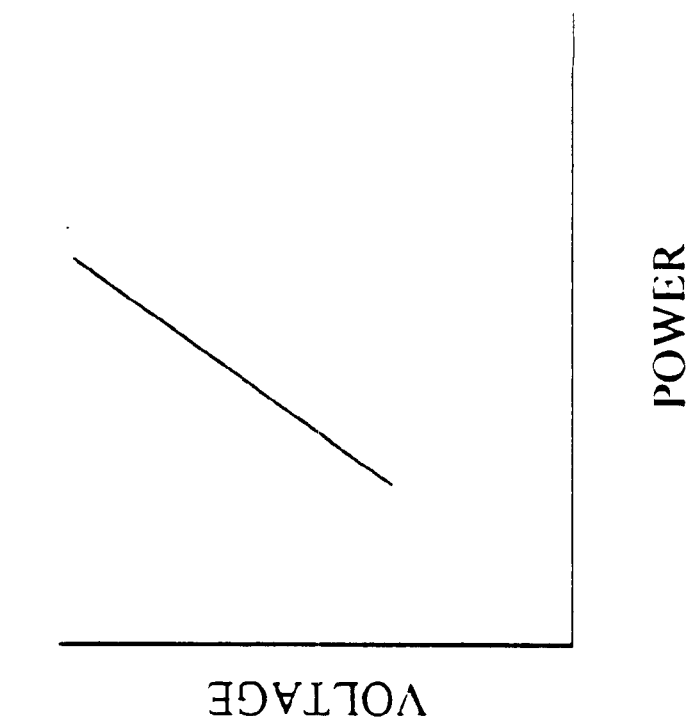
Figure 2A:
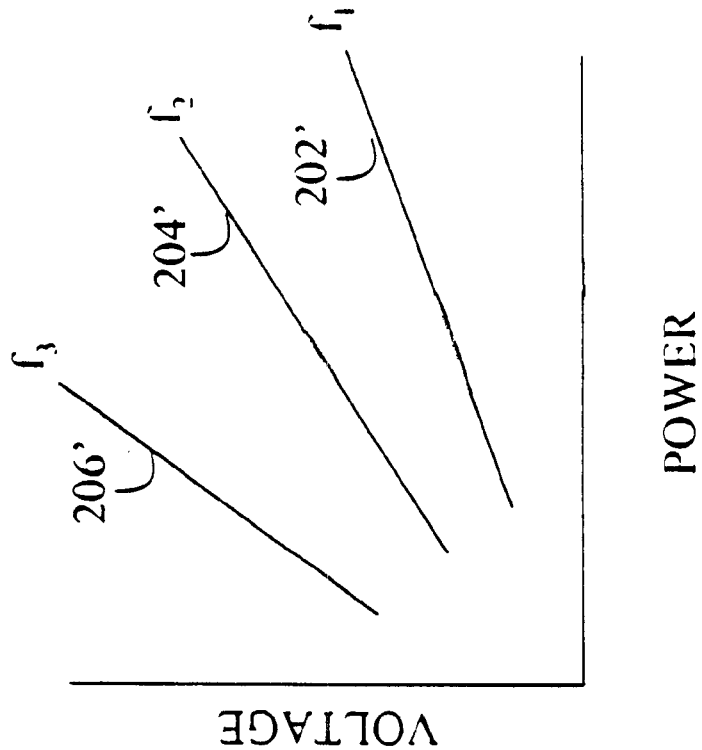

FIG. 2($a$) illustrates in graphical form the relationship between the average power of the broadcast signal and the voltage output from low pass filter 112 in the embodiment of the subject invention illustrated in FIG. 3. As can be seen, for a given frequency of operation, the relationship between the power of the broadcast signal and the voltage output from the low pass filter 112 is substantially linear over the desired region of operation. Thus, for a frequency $f_1$, the line 202' represents the relationship between power and voltage; for a frequency $f_2$, the line 204' represents this relationship; and for the frequency $f_3$, the line 206' represents this relationship.

It should thus be appreciated that the calibration procedure for a mobile unit incorporating a power measurement circuit in accordance with the first embodiment of the subject invention illustrated in FIG. 3 is greatly simplified. Specifically, for a single mode device, the slope K of the line representing the relationship between power and voltage at the frequency of interest is the only parameter that needs to be stored with the device, and for a dual mode device, the slopes $K_1$ and $K_2$ of the respective lines representing the relationship between power and voltage at the frequencies or frequency bands of interest are the only parameters of interest that need to be stored with the device.

A second embodiment of the subject invention comprises a power measurement circuit of the type shown in FIG. 3. In this embodiment, the relationship between the average power of the broadcast signal and the voltage output from low-pass filter 112 is advantageously substantially frequency invariant over the operating region of interest.

In one implementation of this second embodiment, multiplier 302 is a mixer. In this implementation example, it should be appreciated that, in practice, embodiments of mixer 302 may experience a conversion loss which varies with the frequency of either of the two inputs thereof. FIG. 11 illustrates, in graphical form, the relationship between input frequency and conversion loss in a representative practical embodiment of mixer 302. In this embodiment, the relationship illustrated in FIG. 11 is one that holds with respect to either the RF or LO inputs.

As can be seen, in the region 902, the conversion loss is substantially a constant, that is, it is invariant with input frequency, while in the regions 903 and 904, the conversion loss substantially varies with frequency. In accordance with an implementation example of this second embodiment of the invention, the mixer 302 is configured such that it is operating within a region such as region 902 characterized by a conversion loss which is substantially invariant to frequency.

FIG. 2(b) illustrates in graphical form the relationship between the average power of the broadcast signal and the voltage at the output of low pass filter 112 which advantageously applies over all the frequencies or frequency bands in the operating region of interest according to this second embodiment of the invention. It should be appreciated that, in this second embodiment, the calibration procedure for a dual mode phone is even further simplified in relation to the first embodiment in that only the slope, K, of the line need be stored with the device in order to properly calibrate the device over all frequencies or frequency bands of operation.

This frequency invariance is an inherent attribute of the foregoing implementation example in which substantially all the frequency dependent AC components of the output signal are ideally filtered out by low pass filter 112, and the mixer 302 is configured to operate in a linear region of operation such as region 902. Such can be seen in FIG. 4(c), in which the DC voltage output from the low pass filter 112, $A^2/2$, is ideally substantially independent of frequency.

It should be appreciated that embodiments are possible in which mechanisms other than low pass filter 112 are used for measuring the DC component of the output of the multiplier in the foregoing first and second embodiments and in subsequent embodiments of the invention. Thus, in one embodiment, a DC voltmeter or the like which is capable of averaging is used to detect the DC component of the output of mixer 302. For purposes of this disclosure, such devices will be referred to with terms such as "averager." In another embodiment, a device which is capable of integrating the output of the multiplier will suffice for the purpose of producing a signal representative of the average power of the signal of interest or the DC component of the output of the multiplier. For purposes of this disclosure, such a device will be referred to as an "integrator." In yet another embodiment, a unit configured to shape or smooth the output of the multiplier will suffice. For purposes of this disclosure, such units will be referred to as a "shaper" or "smoother." In general, any device configured to remove, at least in part, a frequency component from the output of the multiplier is possible. For purposes of this disclosure, such devices will be referred to with the term "filter," and the term "filter" is understood and intended to be generic to the terms "averager," "integrator," "shaper," and "smoother" used above.

It should also be appreciated that embodiments are possible in which devices other than a mixer are used for multiplying two signals in the foregoing first and second embodiments and in subsequent embodiments of the invention. For purposes of this disclosure, such other devices will be referred to with the generic terms or phrases "multiplier" or "multiplying device."

Figure 5:
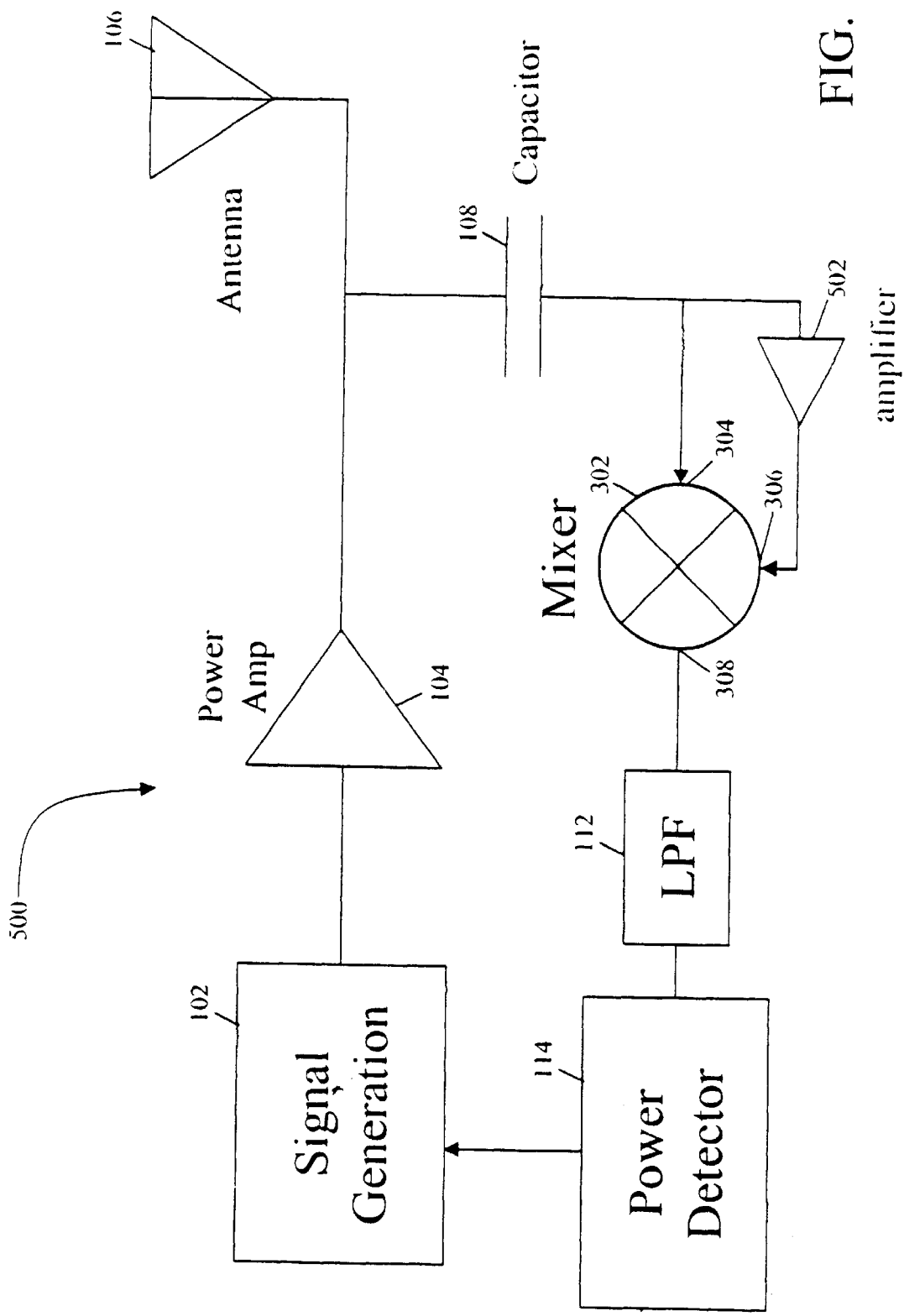
FIG. 5 is an illustration of an implementation of a second embodiment of the subject invention.

FIG. 5 shows a third embodiment 500 of the invention wherein the broadcast signal is coupled to a selected one of the first and second inputs of multiplier 302, and is also coupled to the input of amplifier 502. The output of the amplifier is coupled to the other of the first and second inputs of multiplier 302. In one implementation of this embodiment, in which multiplier 302 is a mixer, the output of amplifier 502 is coupled to the LO input of mixer 302, and the broadcast signal is coupled to the RF input of mixer 302.

In this implementation, the level of amplification performed by amplifier 502 is such that the conversion loss experienced by mixer 302 is substantially invariant to the level of the LO input thereof over the desired range of operation. With reference to FIG. 10, the level of amplification is such that the mixer is operating in a region such as region 901 in FIG. 10.

Another embodiment of the subject invention is illustrated in FIG. 12. As can be seen, this embodiment is similar to the previous embodiment except that here, the broadcast signal is coupled to a selected one of the first and second inputs of multiplier 302, and is also coupled to the input of attenuator 503. The output of the attenuator is coupled to the other of the first and second inputs of multiplier 302.

In one implementation example of this embodiment, in which multiplier 302 is a mixer, the output of attenuator 503 is coupled to the RF input of mixer 302, and the broadcast signal is coupled to the LO input of the mixer 302.

According to this implementation, the level of attenuation performed by attenuator 503 is such that mixer 302 operates in a region of operation in which the conversion loss thereof is substantially invariant to the level of the RF input. FIG. 13 illustrates in graphical form the relationship between conversion loss and the level of RF input in one practical exemplary embodiment of mixer 302. As can be seen, in region 905, the conversion loss is substantially constant, that is, invariant to the level of the RF input, while, in region 906, the conversion loss is substantially dependent on the level of the RF input. In this implementation, the level of attenuation performed by attenuator 503 is preferably set such that mixer 302 is configured to operate in a region such as 905.

Figure 6:
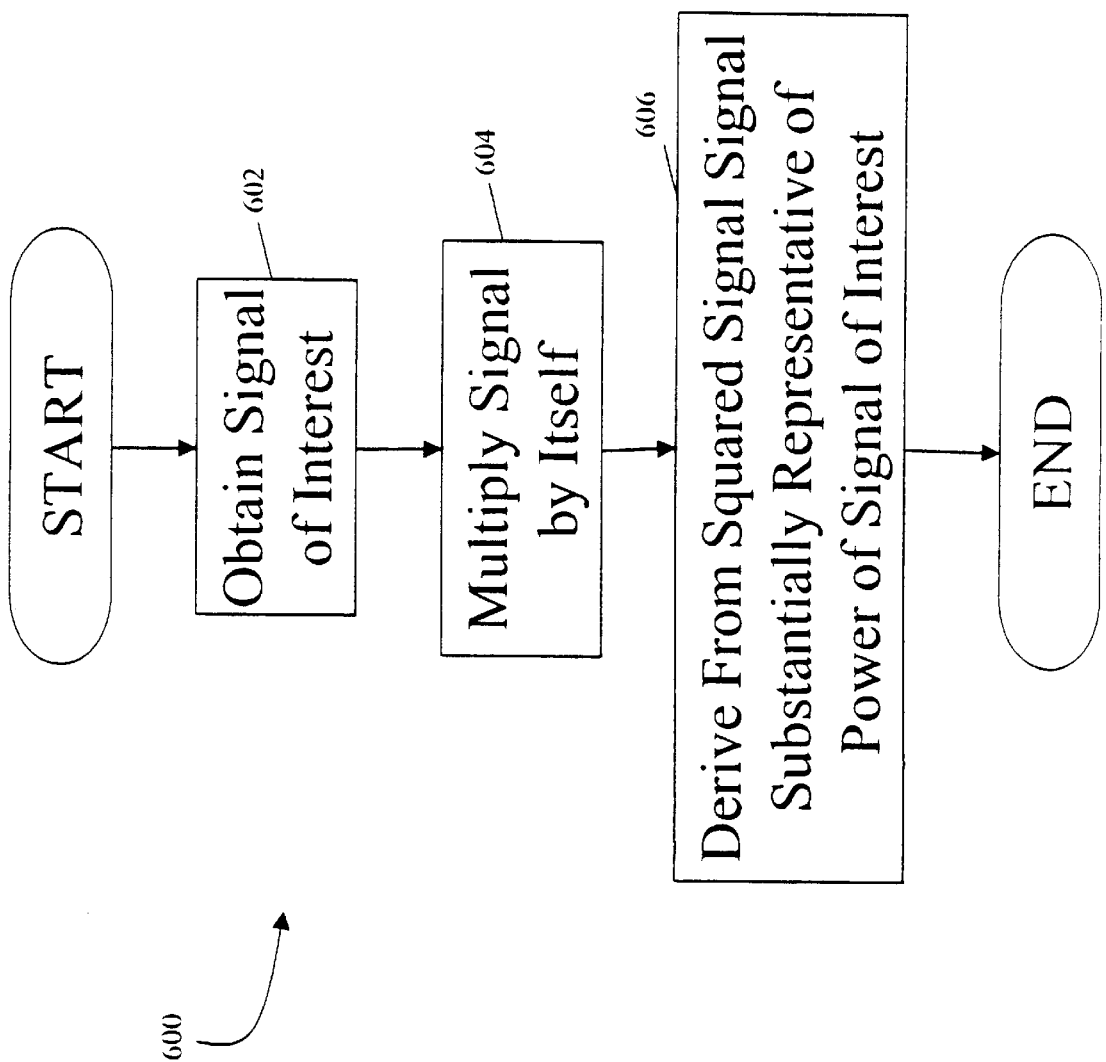
FIG. 6 is a flow chart that illustrates a first embodiment of a method of operation of the subject invention.

FIG. 6 illustrates an embodiment 600 of a method of operation of the subject invention. According to this embodiment, in step 602, the signal of interest is obtained. In one implementation example, the selected signal is a broadcast signal in a mobile communications device such as a mobile phone. In another example, the signal of interest is proportional to or representative of the broadcast signal, such as the case in which the broadcast signal of interest is amplified or otherwise processed to distinguish it from a noisy background or facilitate the multiplication process. In yet another example, the signal of interest may be the DC component of the broadcast signal. In a further example, the signal of interest is obtained by low-pass, band-pass, or high-pass filtering of the broadcast signal. In still a further example, the signal of interest is any signal the power of which is desired to be measured, including signals from environments other than those involving a mobile communications device or communications system.

In step 604 the signal is multiplied by itself. In one example, this squaring of the signal is accomplished by the use of a mixer but the invention is not limited to that embodiment. One variant contemplated, for example, involves measuring the signal of interest, digitizing the data representative of this signal, and then entering this data into a computer. The computer squares the data and then digitally low pass filters the squared data. Another variant contemplated involves the use of a broadcast multiplier to multiply the signal of interest by itself.

In step 606, a signal representative of the power of the signal of interest is derived from the squared signal resulting from step 604. In one example, the signal is substantially representative of or relates to the average power of the signal of interest. In another example, this step involves substantially separating the squared signal into its AC and DC components. In one implementation of this example, this step is accomplished by a low-pass filter. In other examples, it may be useful to retain at least some of the AC components of the original signal. Examples are contemplated in which this step is performed by a filter, averager, integrator, smoother, or shaper. In one example, the step involves providing a signal substantially representative of or relating to the average power of the signal of interest. In other example, it involves providing a signal substantially representative of or relating to the DC component of the output of the multiplier.

Figure 7:
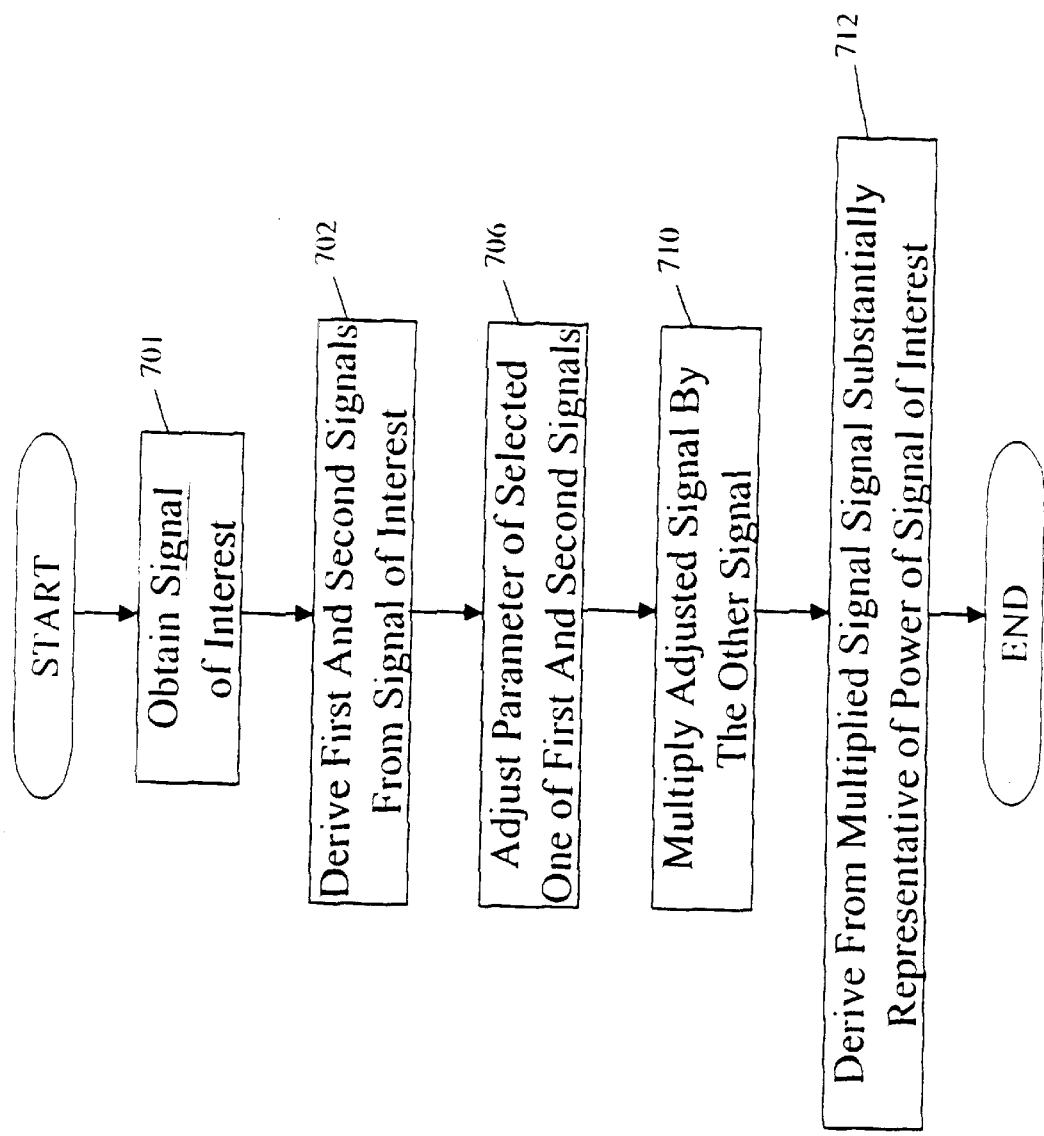
FIG. 7 is a flow chart that illustrates a second embodiment of a method of operation of the subject invention.

FIG. 7 illustrates second embodiment of a method of operation of the subject invention. In step 701, the signal of interest is obtained. In step 702, first and second signals are derived from the signal of interest. In one example, these two signals are the same signal, and in another example, they are different. In the embodiment illustrated in FIG. 5, the first and second signals are the signals respectively provided to the input 304 of mixer 302, and the input of amplifier 502. In the embodiment illustrated in FIG. 12, the first and second signals are the signals respectively provided to the input of attenuator 503, and the input 306 of mixer 302.

In step 706, a parameter of a selected one of the first and second signals is adjusted. It is contemplated that this parameter can be any suitable attribute of the selected signal, including amplitude, phase, frequency, etc. In the embodiment of FIG. 5, the selected signal is the signal provided to the input of the amplifier 502, and the adjustment made to this signal is amplification of its amplitude by means of amplifier 502. In the embodiment of FIG. 12, the selected signal is the signal provided to the input of attenuator 503, and the adjustment made to this signal is attenuation of its amplitude by means of attenuator 503. In one example, the adjustment is made to facilitate the achievement of a substantially linear relationship between the average power of the signal of interest and the voltage representative of the average power of this signal as output from a low-pass filter.

In step 710, the adjusted signal is multiplied by the other signal. In step 712, a signal representative of the power of the signal of interest is derived from the multiplied signal provided in step 710. In one embodiment, the derived signal is substantially representative of or relates to the average power of the signal of interest. Examples are contemplated in which this step is performed by a filter, averager, integrator, smoother, or shaper. In one example, the step involves providing a signal substantially representative of or relating to the average power of the signal of interest. In another example, the step involves providing a signal substantially representative of or relating to the DC component of the output of the multiplier.

EXAMPLE

A prototype of an embodiment of the power measurement circuit of the subject invention described above was built and tested. A block diagram of the major components of this prototype are shown in FIG. 8. As can be seen, the major components of this prototype include power splitter 806, attenuator 808, mixer 802, and voltmeter 814. An input signal 804 is provided as an input to power splitter 806. One output of the power splitter is input to attenuator 808, and the output of the attenuator is coupled to the RF input of mixer 802. The other output of the power splitter is coupled to the LO input of mixer 802. The output of the mixer, identified in the figure as the IF output, is provided to voltmeter 814. In this prototype, the mixer employed is a Model SCM2500 mixer from Mini-Circuits, Brooklyn, N.Y. Moreover, the attenuator employed attenuates the signal provided to the RF input of the mixer by 10 dB. Note that, in this embodiment, voltmeter 814 functions to determine the DC component of the IF output of mixer 802. Consequently, a low-pass filter is not included.

The prototype was tested by varying the power of the input signal over a wide range, specifically, from 0.20–125.89 mW. Four different frequencies were tested, 824 MHz, 848 MHz, 1850 MHz, and 1910 MHz. FIG. 9(*a*) illustrates in graphical semi-log form the traces 907, 908, 909, and 910 of the input power to voltage relationship for each respective frequency, with input power plotted on a logarithmic scale, and detected voltage plotted on a linear scale. FIG. 9(*b*) illustrates the trace 907 for 824 MHz plotted with the input power scale reversed so that it is increasing to the right in contrast to the left as shown in FIG. 9. FIG. 9(*c*) illustrates in tabular form the same data which is plotted in FIGS. 9(*a*) and 9(*b*). Note that the power to voltage curves at 824 MHz and at 848 MHz (traces 907 and 908 respectively) are very nearly identical and that the power to voltage curves at 1850 MHz and 1910 MHz (traces 909 and 910 respectively) are also similar. As can be seen, over the region 1.00–125.89 mW, each curve is substantially linear. In addition, for a given frequency band of interest, either 824–848 MHz or 1850–1910 MHz, the curves for the frequencies within that band are substantially identical. Accordingly, this data demonstrated that the prototype worked for its intended purpose.

While embodiments and applications of this invention have been shown and described, it should be apparent to those of ordinary skill in the art that these examples are merely illustrative, and that many other embodiments are possible without departing from the spirit and scope of the subject invention. Accordingly, the invention is not to be restricted, except as by the appended claims.

What is claimed is:

1. A communications device including a first circuit for generating a broadcast signal having a power, and a power measurement circuit for measuring the power of the broadcast signal, the power measurement circuit comprising:

a multiplier having first and second inputs and an output, with the first and second signals derived from the broadcast signal, the first and second signals coupled respectively to the first and second inputs of the multiplier; and a filter having an input and an output such that the input of said filter is coupled to the output of said multiplier.

2. A communications system comprising a plurality of base stations and mobile communications devices, with each base station configured to communicate with corresponding ones of the mobile communications devices through a wireless interface, at least one such mobile communications device or base station including a first circuit for generating a broadcast signal having a power, and a second circuit for setting the power of the broadcast signal to a desired level responsive, at least in part, to an output of a power measurement circuit, the power measurement circuit comprising:

a multiplier having first and second inputs and an output, with first and second signals derived from the broadcast signal, the first and second signals coupled respectively to the first and second inputs of the multiplier; and a filter having an input and an output such that the input of said device is coupled to the output of said multiplier.

3. A dual mode mobile phone configured to operate in a plurality of distinct frequency bands, the phone including a first circuit for generating a broadcast signal having a power, and a second circuit for setting the power of the broadcast signal to a desired level responsive, at least in part, to an output of a power measurement circuit, the power measurement circuit comprising:

a multiplier having first and second inputs and an output, with the first and second signals derived from the broadcast signal, and the first and second signals coupled respectively to the first and second inputs of the multiplier; and a filter having an input and an output such that the input of said filter is coupled to the output of said multiplier;

wherein the power measurement circuit is configured to control the second circuit in at least two of the plurality of frequency bands.

4. The phone of claim 3 wherein the broadcast signal has an average power, and the output of the power measurement circuit has a substantially linear relationship with the average power of the broadcast signal over a desired region of operation.

5. The phone of claim 3 wherein the output of the power measurement circuit is substantially invariant to at least two of the plurality of frequency bands.

6. A communications system comprising a plurality of satellites and mobile communications devices, with each satellite configured to communicate with corresponding ones of the mobile communications devices through a wireless interface, at least one such mobile communications device or satellite including a first circuit for generating a broadcast signal having a power, and a second circuit for setting the power of the broadcast signal to a desired level responsive, at least in part, to an output of a power measurement circuit, the power measurement circuit comprising:

a multiplier having first and second inputs and an output, with first and second signals derived from the broadcast signal, the first and second signals coupled respectively to the first and second inputs of the multiplier; and a filter having an input and an output such that the input of said filter is coupled to the output of said multiplier.

7. In a communications device having a signal of interest, a power measurement circuit comprising:

a multiplier having first and second inputs and an output, with first and second signals derived from the signal of interest coupled respectively to the first and second inputs of the multiplier, the signal of interest having an average power; and a filter having an input and an output such that the input of said filter is coupled to the output of said multiplier, and the filter is configured to provide a signal at the output thereof;

wherein the communications device includes a memory for storing data representative of a substantially linear relationship between the average power of the signal of interest and a parameter of the signal output from the filter.

* * * * *